United States Patent [19]
Pilling et al.

[11] Patent Number: 5,680,360
[45] Date of Patent: Oct. 21, 1997

[54] CIRCUITS FOR IMPROVING THE RELIABLITY OF ANTIFUSES IN INTEGRATED CIRCUITS

[75] Inventors: David J. Pilling, Los Altos Hills; Raymond M. Chu, Saratoga; Sik K. Lui, Sunnyvale, all of Calif.

[73] Assignee: Integrated Device Technology, Inc., Santa Clara, Calif.

[21] Appl. No.: 473,039

[22] Filed: Jun. 6, 1995

[51] Int. Cl.$^6$ ............................................. G11C 17/16
[52] U.S. Cl. .................. 365/225.7; 365/96; 365/189.02; 365/189.05; 365/189.09
[58] Field of Search .................. 365/189.05, 189.09, 365/189.02, 230.02, 225.7, 96

[56] References Cited

U.S. PATENT DOCUMENTS

| | | | |
|---|---|---|---|
| 5,299,152 | 3/1994 | Ishihara et al. | 365/225.7 X |
| 5,334,880 | 8/1994 | Abadeer et al. | 365/225.7 X |
| 5,384,727 | 1/1995 | Moyal et al. | 365/225.7 X |
| 5,426,614 | 6/1995 | Harward | 365/225.7 |
| 5,448,187 | 9/1995 | Kowalski | 365/225.7 X |
| 5,469,396 | 11/1995 | Eltoukhy | 365/225.7 X |

*Primary Examiner*—Do Hyun Yoo
*Attorney, Agent, or Firm*—Skjerven, Morrill, MacPherson, Franklin & Friel

[57] ABSTRACT

A circuit improves the reliability of antifuses in certain types of systems by substantially eliminating the continuous undesirable applications of voltages across antifuse terminals. To accomplish this, an antifuse has applied across its two terminals a "reading" or "evaluation" voltage as required by the system operation for a single read or evaluation clock period (typically 5 ns to 30 ns in duration). The signal describing the state of the antifuse is then stored in a latch, register, or other suitable structure for subsequent sampling. In this manner, a low read current flows in the antifuse in response to the standard chip operating voltage for only a short period of time such as a single clock cycle. Thus, continuous voltages across the two terminals of the antifuse are avoided and an unprogrammed antifuse is not inadvertently programmed and a programmed antifuse is not inadvertently converted back to its high impedance state (i.e. "unprogrammed"). In another embodiment, a multiplexer coupled to a terminal of the antifuse switches the terminal of the antifuse to a programming voltage node when the antifuse is selected for programming and to a reference voltage source when the antifuse is not selected for programming. The multiplexer prevents undesired voltages from being applied across the antifuse while other antifuses are being programmed. The two embodiments discussed may be used in conjunction with each other or separately.

23 Claims, 2 Drawing Sheets

CIRCUITS FOR IMPROVING THE RELIABLITY OF ANTIFUSES IN INTEGRATED CIRCUITS

FIELD OF THE INVENTION

This invention relates to programmable integrated circuits and more particularly to circuits for improving the reliability of antifuses.

BACKGROUND

An antifuse circuit element used in integrated circuits is a resistive fuse component which in the unprogrammed state has a very high (i.e. at least hundreds of megaohms) impedance but which when programmed has a low impedance, typically on the order of a few hundred ohms or less. The antifuse is programmed by applying a programming voltage, larger in magnitude than normal operating voltages, across the terminals of the antifuse for a sufficient time to change the impedance of the antifuse from high to low. An antifuse may comprise a sandwich of thin film dielectric materials such as silicon dioxide, silicon nitride, and silicon dioxide (sometimes called "ONO" for "oxide-nitride-oxide") disposed between two conductors, or the antifuse may include a layer of undoped amorphous silicon between two conductors.

The integrity of the antifuse in both its programmed and unprogrammed states is adversely affected by several factors. For example, elevated operating temperatures of the integrated circuit associated with current flowing through a programmed antifuse or a continuous voltage bias across and current flow through the programmed antifuse can degrade the conductivity of a programmed antifuse over time causing a deleterious change in the operation of the circuit containing the antifuse. A voltage bias across the terminals of a programmed antifuse associated with continuous current flow during normal operating conditions may cause the programmed antifuse to return to the high impedance non-programmed characteristic of an open circuit.

When used in an array, an antifuse to be programmed is selected by decoding the address of the to-be-programmed antifuse and electrically programming the selected antifuse by applying an external programming voltage, Vpp, across the terminals of the antifuse. Although the external programming voltage Vpp should only be applied across those antifuses selected to be programmed on a one-by-one basis, non-selected antifuses may be subjected unintentionally to the programming voltage which may result in the unintentional programming of an unprogrammed antifuse. Additionally, an antifuse frequently evaluated by a read voltage across the antifuse terminals may also result in unintentionally changing the programmed or unprogrammed state of the antifuse.

In an integrated circuit, a single defective antifuse or an unintentionally programmed or deprogrammed antifuse can cause an entire integrated circuit to malfunction. This can severely reduce manufacturing yields and reliability, and increases costs.

SUMMARY OF THE INVENTION

The present invention improves the reliability of antifuses in certain types of systems by substantially eliminating the continuous undesirable applications of voltages across antifuse terminals. To do this, an antifuse has applied across its two terminals a "reading" or "evaluation" voltage as required by the system operation for a single read or evaluation clock period (typically 5 ns to 30 ns in duration). The signal describing the state of the antifuse is then stored in a latch, register, or other suitable structure for subsequent sampling. In this manner, a low read current flows in the antifuse in response to the standard chip operating voltage for only a short period of time. Thus continuous voltages across the two terminals of the antifuse are avoided and an unprogrammed antifuse is not inadvertently programmed and a programmed antifuse is not inadvertently converted back to its high impedance state (i.e. "unprogrammed").

In one embodiment, a circuit includes a source of a first potential, a source of a second potential, and a source of a reference potential. The circuit further includes an antifuse having a first terminal coupled to the first potential source and a second terminal, a switching circuit having a select terminal for receiving a selection signal, an input terminal coupled to the antifuse second terminal, a first output terminal coupled to the second potential source, and a second output terminal coupled to the reference potential source. The switching circuit, in response to the selection signal, couples the input terminal to the first output terminal during a programming operation of the antifuse and couples the input terminal to the second output terminal during a read operation of the antifuse. The circuit further includes a memory capable of being coupled and decoupled to the antifuse. The memory being coupled to the antifuse during at least a portion of the read operation.

In another embodiment, a multiplexer coupled to a terminal of the antifuse switches the terminal of the antifuse to a programming voltage node when the antifuse is selected for programming and to a reference voltage source when the antifuse is not selected for programming. The multiplexer prevents undesired voltages from being applied across the antifuse while other antifuses are being programmed.

BRIEF DESCRIPTION OF THE DRAWINGS

Reference numerals referring to the same feature appearing in multiple figures are the same.

DETAILED DESCRIPTION

The following description of the invention is intended to be illustrative only and not limiting. Antifuses used in typical integrated circuits such as memories, microprocessors, and field programmable gate arrays are typically organized into an array or other suitable structure. Antifuses are selected for programming by a select circuit or other addressing circuitry of well known design. During programming, a programming voltage is selectively and sequentially applied across each antifuse designated for programming. Non-designated antifuses are protected from the programming voltage to prevent unintentional programming or deprogramming. Typically a variable voltage source external to the integrated circuit being programmed is coupled to an external programming pin on the integrated circuit being programmed which is coupled to a node of the antifuse being programmed to establish the programming voltage.

The external programming pin is generally stressed for voltages consistent with electrostatic discharge (ESD) levels which typically exceed positive and negative two thousand volts (2000 V). However, an antifuse coupled to the programming pin and all other antifuses are susceptible to damage from ESD levels unless they are adequately protected from the ESD levels. One way of protecting each antifuse is to isolate all antifuses from potential sources of ESD voltages during non-operational modes. Effective isolation substantially decreases the probability of the state of an antifuse being inadvertently changed with the resulting undesirable consequences for the circuit in which the antifuse is located. According to this invention, the state of an antifuse is preferably stored in a latch, register, or other suitable structure and thus is available for continuous sampling without subjecting the antifuse to additional read voltages. Decreasing the time a voltage is applied to an antifuse increases the reliability of the antifuse which in turn increases the reliability of the circuit incorporating the antifuse.

Figure 1:
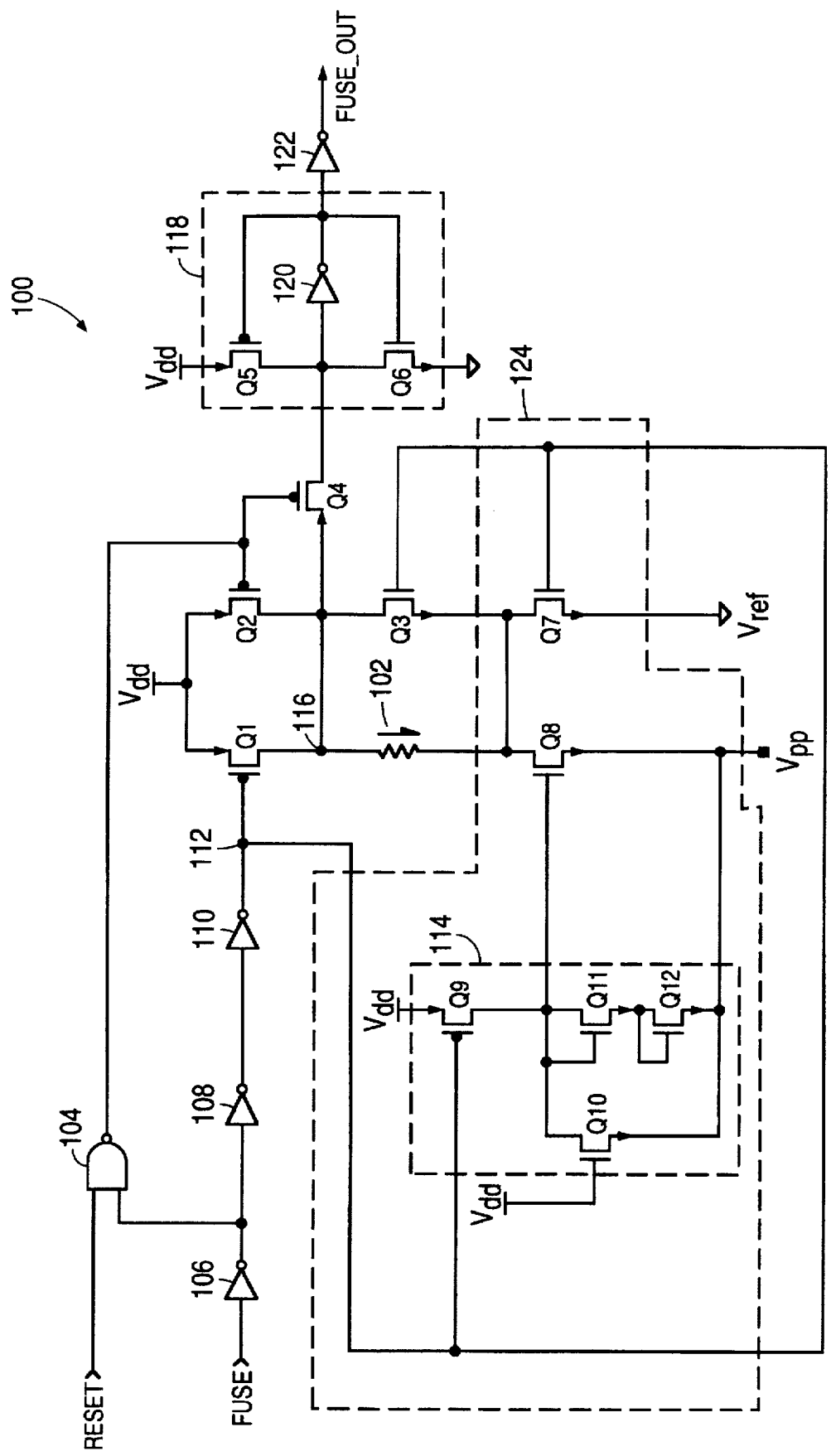
FIG. 1 illustrates a schematic diagram of one embodiment of a circuit for improving the reliability of antifuses.

Referring to FIG. 1, one embodiment of a circuit for improving the reliability of an antifuse is illustrated. When antifuse circuit 100 is selected for programming antifuse 102, the select circuit (not shown but of a type well known) applies a high voltage program signal such as +5 V to the FUSE node ("FUSE") and applies a low voltage read signal such as zero volts (0V) to the RESET node ("RESET"). Vpp is coupled to a below system ground voltage of −5 V during programming. The low voltage signal on RESET is applied to one input lead of NAND gate 104 to disable NAND gate 104. The other input lead to NAND gate 104 is connected to the output lead of inverter 106, the input lead of which is connected to the FUSE terminal. Consequently, when the signal on RESET is low, a low or high voltage signal on FUSE has no effect on the NAND gate 104 output signal, which remains high. The high output voltage signal from NAND gate 104 is transmitted to the gates of P-channel transistors Q2 and Q4 thereby turning "off" these two P-channel transistors. Inverters 106, 108, and 110 invert the high voltage signal on the FUSE terminal to a low voltage signal on select node 112. The low voltage signal applied to multiplexer select node 112 during programming causes P-channel MOS transistors Q1 and Q9 to conduct and causes N-channel MOS transistors Q7 and Q3 to be nonconductive. Inverters 106, 108, and 110 match delay through NAND gate 104 and prevent simultaneous conduction by transistor Q1 and transistors Q2 and Q4.

Conducting transistor Q9 establishes a current path through diode connected N-channel MOS transistors Q11 and Q12. Voltage bias circuit 114 establishes a bias voltage on the gate of N-channel MOS transistor Q8 equal to gate to source voltage ("Vgs") drops across transistors Q11 and Q12 less Vpp causing transistor Q8 to conduct.

Conducting transistors Q1 and Q8 apply a programming voltage of approximately Vdd−Vpp across unprogrammed antifuse 102. Initially, in response to this programming voltage, a small programming current flows through antifuse 102. As the resistance of antifuse 102 decreases, the programming current increases. The non-linear drain-to-source voltage ("Vds") versus drain current ("Id") characteristics of transistors Q1 and Q8 limit the programming current. After approximately 1 μs, the programming voltage across antifuse 102 reduces the resistance of now programmed antifuse 102 to a few hundred ohms or less.

After programming, the FUSE terminal is brought to a low voltage, typically zero volts. The low voltage signal on the FUSE terminal produces a high voltage on the NAND gate 104 second input lead, thus allowing RESET to maintain control of NAND gate 104. Inverters 106, 108, and 110 invert the low voltage signal at FUSE and charge select node 112 to approximately +5 V. P-channel MOS transistor Q9 is turned "off" by the high voltage signal on select node 112. N-channel MOS transistor Q10, which is normally "on", discharges the gate of N-channel MOS transistor Q8 to approximately Vpp turning off Q8 and thereby decoupling antifuse 102 from Vpp. The high voltage signal on multiplexer select node 112 causes N-channel MOS transistors Q3 and Q7 to conduct and couple both terminals of antifuse 102 to Vref where Vref is connected to a ground reference.

During an initial read operation, a high voltage read signal of +5 V is applied to RESET by the select circuit (not shown) and Vpp is connected to system ground (by a circuit, not shown, of well known design). The high voltage signal on RESET enables NAND gate 104 to apply a low voltage signal to respective gates of transistors Q2 and Q4 which causes transistors Q2 and Q4 to conduct.

During the initial read operation, if antifuse 102 is not programmed, transistors Q2, Q3, and Q7 establish a current path between Vdd and Vref. Negligible current flows through unprogrammed antifuse 102. Transistor Q3, a high impedance transistor, and transistor Q7 provide a higher series impedance than the impedance of transistor Q2. This voltage divider (made up of series connected Q2, Q3 and Q7) charges read output node 116 to a voltage ranging from about 3V to about +5 V (logic "1"). Conducting transistor Q4 transfers the logic "1" to the input of latch 118. Latch 118 latches the logic "1" via cross coupled inverter 120 and inverter coupled P-channel MOS transistor Q5 and N-channel MOS transistor Q6 and transfers a voltage of about 0 V to the input of inverting output driver 122. Inverting output driver 122 establishes a logic "1" on the FUSE_OUT node ("FUSE_OUT").

If antifuse 102 is programmed during the initial read operation, a current path is established between Vdd and Vref through transistor Q2, antifuse 102, and transistor Q7. The relatively low resistance of antifuse 102 compared to the impedance of Q3 causes transistor Q3 to conduct very little current. The relative impedances of series connected transistor Q2, antifuse 102, and transistor Q7 discharge read output node 116 to about 0–2V (logic "0"). The voltage drop between read output node 116 and the transistor Q4 gate exceeds the threshold voltage (Vth) of transistor Q4 causing transistor Q4 to conduct and transfer the logic "0" on node 16 to the input lead of latch 118. Latch 118 inverts the latched logic "0" to a logic "1" which is applied to the input terminal of inverting output driver 122. Inverting output driver 122 establishes a logic "0" on FUSE_OUT.

Latch 118 and output driver 122 maintain the information read from antifuse 102 at FUSE_OUT. All subsequent read operations require sampling FUSE_OUT rather than repeating the initial read operation. Limiting the number of accesses to antifuse 102 significantly prolongs the life and thus the reliability of antifuse 102.

Multiplexer 124 also significantly improves the reliability of antifuse 102. Since Vpp will be brought below system ground during programming of other antifuses, select node 112 insures that multiplexer 124 only couples antifuse 102 to Vpp when antifuse 102 is selected for programming. This selective decoupling of Vpp from programmed antifuse 102 prevents unwanted Vdd minus Vpp voltage drops across antifuse 102.

Additionally, during non-program operations high impedance transistor Q3 conducts and provides a discharge path for any residual charge existing on the upper terminal (connected to read output node 116) node of antifuse 102. Furthermore, transistor Q8 preferably has a 100–200 μm channel width and a 2 μm length and transistor Q7 has a 50–150 μm channel width and a 2 μm length to effectively isolate antifuse 102 from ESD voltages applied to the Vpp and Vref terminals, respectively, while maintaining antifuse circuit 100 integrity.

Figure 2:
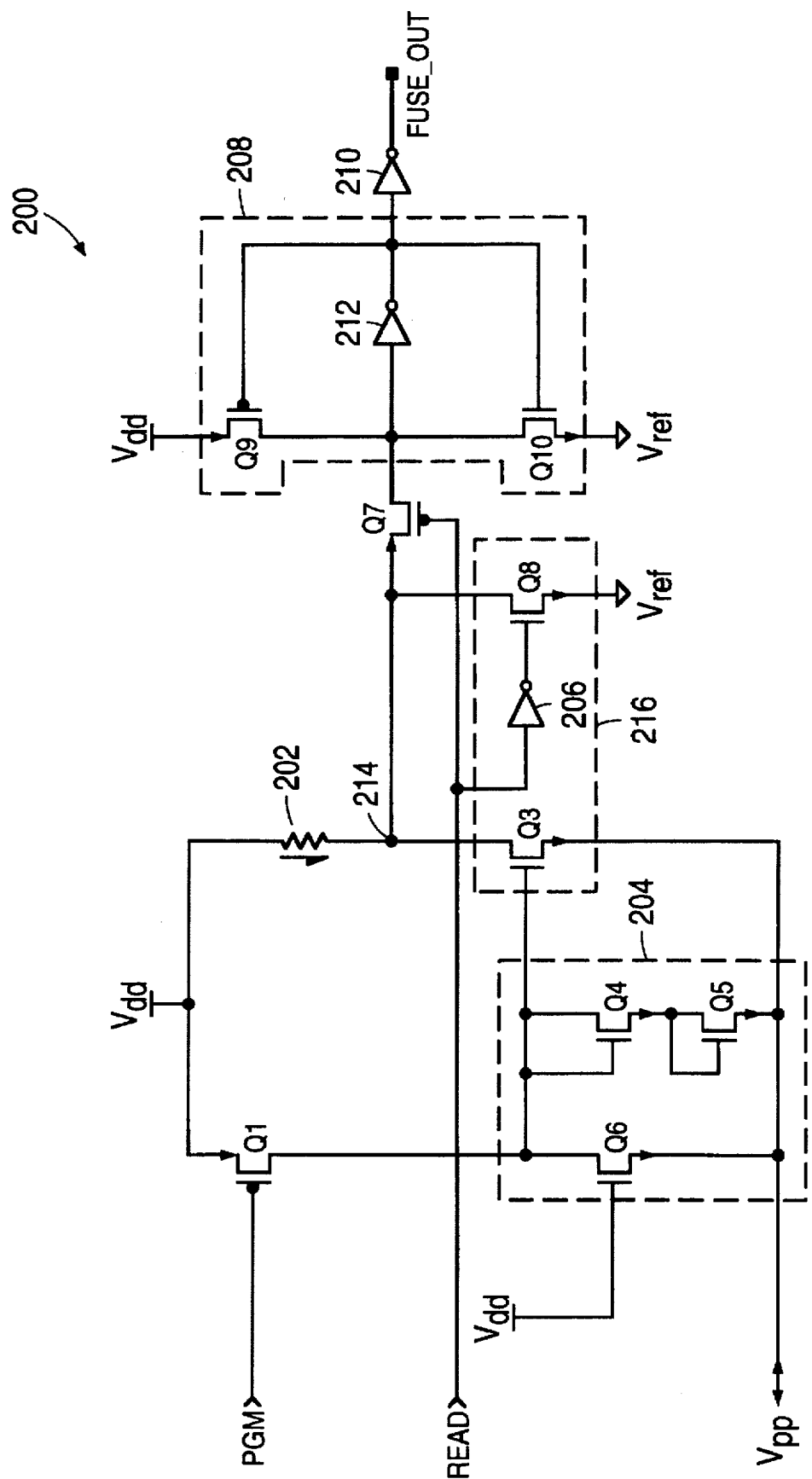
FIG. 2 illustrates a schematic diagram of another embodiment of a circuit for improving the reliability of antifuses.

Referring to FIG. 2, another embodiment of an antifuse circuit for improving the reliability of antifuses is illustrated. When antifuse circuit 200 is selected for programming antifuse 202, the select circuit (not shown) applies a low voltage program signal such as 0 V to PGM node ("PGM") connected to the gate of P-channel MOS transistor Q1 and applies a high read signal voltage such as +5 V to the READ node ("READ"). Vpp is coupled to a below system ground voltage source having a voltage of −5 V. Applying the high voltage signal on READ prevents transistor Q7 from conducting. Inverter 206 inverts the high voltage signal on READ and applies a low voltage signal to the gate of N-channel transistor Q8 which prevents transistor Q8 from conducting.

Application of the low signal voltage at PGM to the gate of transistor Q1 causes transistor Q1 to conduct. Conducting transistor Q1 establishes a current path from Vdd to Vpp through voltage bias circuit 204. Voltage bias circuit 204 functions identically to voltage bias circuit 114 (FIG. 1). Voltage bias circuit 204 establishes a bias voltage on the gate of N-channel MOS transistor Q3 causing transistor Q3 to conduct. Initially, very little programming current flows through antifuse 202, and, with transistor Q3 conducting, a programming voltage approximately equal to Vdd minus Vpp is applied across antifuse 202. This programming voltage applied for 1 μs causes the resistance of antifuse 202 to decrease to a few hundred ohms or less. The non-linear Vds–Id characteristic of transistor Q3 limits the programming current flowing through antifuse 202.

Transistor Q3 not only couples Vdd and Vpp across antifuse 202, transistor Q3 also protects antifuse 202 from excessive programming current. After programming antifuse 202, PGM is brought to a high voltage of about +5 V for all non-programming operations which prevents transistor Q1 from conducting. Transistor Q6 conducts as long as Vdd minus Vpp exceeds Vth of transistor Q6. With transistor Q1 turned "off," transistor Q6 discharges the gate of transistor Q3 to Vpp which prevents transistor Q3 from conducting.

During an initial read operation, the select circuit (not shown) applies 0V to the READ terminal. Inverter 206 inverts the low voltage signal on READ and applies a high voltage signal to the gate of transistor Q8 causing Q8 to conduct.

During the initial read operation, if antifuse 202 is not programmed, transistors Q8 and Q7 establish a current path between Vref and the input of latch 208. Pass transistor Q7 transfers a logic "0" to the latch 208 input. Latch 208 functions identically to latch 118 and includes cross-coupled inverter 212 and inverter-coupled P channel transistors Q9 and N channel transistor Q10. Latch 208 transfers a logic "1" output signal to the input terminal of inverter output driver 210. Inverter output driver 210 establishes a low level signal corresponding to a logic "0" on FUSE_OUT.

If antifuse 202 is programmed, during the initial read operation a current path is established between Vdd and Vref through antifuse 202 and transistor Q8. The relatively low impedance of programmed antifuse 202 compared to the impedance of conducting transistor Q8 causes read output node 214 to charge to a logic "1". Pass transistor Q7 transfers a high level signal corresponding to the logic "1" at read output node 214 to the input terminal of latch 208. Latch 208 transfers a low-level signal corresponding to a logic "0" to the input terminal of inverter output driver 210, and inverter output driver 210 asserts a high level signal corresponding to a logic "1" on FUSE_OUT.

Latch 208 and output driver 210 maintain the information read from antifuse 202 at FUSE_OUT. All subsequent read operations require sampling FUSE_OUT rather than repeating the initial read operation. Limiting the number of accesses to antifuse 202 significantly prolongs the life and thus the reliability of antifuse 202.

The coupling of multiplexer 216 also significantly improves the reliability of antifuse 202. Since Vpp will be brought below system ground during programming of other antifuses, multiplexer 216 only couples antifuse 202 to Vpp when antifuse 202 is selected for programming. This selective decoupling of Vpp prevents unwanted Vdd minus Vpp voltage drops across antifuse 202.

It will be appreciated that the circuit of this invention improves the reliability of integrated circuits containing antifuses. For example, other voltage levels may be used to program and read the antifuses of FIGS. 1 and 2. Furthermore, additional antifuse ESD protection may be added to the antifuse circuits of FIGS. 1 and 2. For example, transistors Q1 and Q2 of FIG. 1 may be sized to encounter ESD voltages while preserving functional integrity. Other embodiments, modifications and improvements not described herein will be obvious to those of ordinary skill in the art in view of this disclosure.

What is claimed is:

1. A circuit comprising:
    a source of a first potential;
    a source of a second potential;
    a source of a reference potential;
    an antifuse having a first terminal coupled to the first potential source and a second terminal;
    a switching circuit having a first select terminal for receiving a selection signal, an input terminal coupled to the antifuse second terminal, a first output terminal coupled to the second potential source, and a second output terminal coupled to the reference potential source, wherein the switching circuit, in response to the selection signal, couples the input terminal to the first output terminal during a programming operation of the antifuse and couples the input terminal to the second output terminal during a read operation of the antifuse; and
    a memory capable of being coupled and decoupled to the antifuse, the memory being coupled to the antifuse during at least a portion of the read operation.

2. A circuit as in claim 1 wherein the switching circuit is a multiplexer.

3. A circuit as in claim 1 wherein the switching circuit includes a second select terminal.

4. A circuit as in claim 1 wherein the switching circuit, in response to a select signal, couples the first output terminal to the second potential source during the antifuse programming operation and couples the second output terminal to the reference potential source during the antifuse read operation.

5. A circuit as in claim 1 wherein the switching circuit further comprises:
    a voltage bias circuit having an input terminal coupled to the first select terminal and an output terminal;

a first NMOS field effect transistor having a gate coupled to the voltage bias circuit output terminal, a drain coupled to the antifuse second terminal, and a source coupled to the second potential source; and a second NMOS field effect transistor having a gate coupled to the first select terminal, a drain coupled to the antifuse second terminal, and a source coupled to the reference potential source.

6. A circuit as in claim 5 wherein the voltage bias circuit comprises:

a PMOS field effect transistor having a gate coupled to the first select terminal, a source coupled to the first potential source, and a drain coupled to the gate of the first NMOS transistor;

a third NMOS field effect transistor having a gate and a drain coupled to the gate of the first NMOS transistor and a source;

a fourth NMOS field effect transistor having a gate and a drain coupled to the source of the third NMOS transistor and a source coupled to the second potential source; and a discharge circuit coupled across the voltage bias circuit output terminal and the second potential source.

7. A circuit as in claim 1 further comprising:

an output terminal coupled between the antifuse and the memory; a read enable terminal; and a switch coupled between the output terminal and one of either the antifuse first or second terminals and having a control terminal coupled to the read enable terminal.

8. A circuit as in claim 1 wherein the memory is a latch, the latch having an input terminal exclusively coupled to one of either the antifuse first or second terminals.

9. A circuit as in claim 1 further comprising:

a discharge circuit coupled across the first and second terminals of the antifuse and coupled to the reference potential source to discharge any residual charge on the first and second terminals of the antifuse after the programming operation.

10. A circuit as in claim 1 wherein the difference between the first potential and the second potential is greater than the difference between the first potential and the reference potential.

11. A circuit comprising:

an antifuse having first and second terminals and having a state;

a source of a first voltage coupled to the first antifuse terminal;

a register for storing information relating to the state of the antifuse having an input terminal coupled to a selected one of the first and second antifuse terminals;

a source of a programming voltage;

a source of a reference voltage distinct from the programming voltage source;

a switching circuit having respective terminals coupled to the antifuse second terminal, the progamming voltage source, and the reference voltage source to switch the antifuse second terminal between the programming voltage source and the reference voltage source in response to a control signal, wherein the switching circuit is a multiplexer having an input terminal coupled to the antifuse second terminal, a first output terminal coupled to the programming voltage source, and a second output terminal coupled to the reference voltage source; and a switch coupled between the antifuse and the register to selectively couple the antifuse to the register during an antifuse read operation and to otherwise isolate the antifuse from the register.

12. A circuit as in claim 11 wherein the register is exclusively associated with the antifuse.

13. A circuit as in claim 11 wherein the switching circuit switches the antifuse second terminal to the programming voltage source during antifuse programming and to the reference voltage source during non-programming of the antifuse.

14. A circuit comprising:

an antifuse having first and second terminals and having a state;

a source of a first voltage coupled to the first antifuse terminal;

a register for storing information relating to the state of the antifuse having an input terminal coupled to a selected one of the first and second antifuse terminals;

a source of a programming voltage;

a source of a reference voltage distinct from the progamming voltage source;

a switching circuit having respective terminals coupled to the antifuse second terminal, the progamming voltage source, and the reference voltage source to switch the antifuse second terminal between the progamming voltage source and the reference voltage source in response to a control signal;

a switch coupled between the antifuse and the register to selectively couple the antifuse to the register during an antifuse read operation and to otherwise isolate the antifuse from the register;

a program enable terminal;

a first transistor having a control terminal coupled to the program enable terminal and a pair of current terminals coupled in series between the first voltage source and the first antifuse terminal;

a read enable terminal;

a second transistor having a control terminal coupled to the read enable terminal and a pair of current terminals coupled in series between the first voltage source and the first antifuse terminal; and a pass transistor having a control terminal coupled to the read enable terminal and a pair of current terminals coupled in series between the first antifuse terminal and the register input terminal.

15. A circuit as in claim 14 further comprising:

a logic gate having an output coupled to the read enable terminal, a first input terminal for receiving a register RESET signal, and a second input terminal for receiving an antifuse PROGRAM signal.

16. A circuit as in claim 14 wherein the transistors are metal oxide semiconductor field effect transistors.

17. A circuit comprising:

a source of a first voltage;

a source of a second voltage;

a source of a reference voltage, wherein the source of the reference voltage is isolated from the source of the second voltage, and wherein the difference between the first voltage and the second voltage is greater than the difference between the first voltage and the reference voltage;

an antifuse having a first terminal coupled to the first source and a second terminal;

a read enable terminal;

a pass transistor having a first terminal coupled to one of the antifuse first and second terminals, a second terminal, a control terminal operatively coupled to the read enable terminal to control electrical coupling of the pass transistor first terminal to the pass transistor second terminal;

a latch having an input terminal coupled to the pass transistor first terminal and an output terminal; and a switching circuit having respective terminals coupled to the antifuse second terminal, the second source, and the reference voltage source to switch the antifuse second terminal between the second voltage source and the reference voltage source.

18. A circuit as in claim 17 wherein the pass transistor first terminal is coupled to the antifuse second terminal and the switching circuit includes:

a first transistor having a control terminal, a first current terminal coupled to the antifuse second terminal, and a second current terminal coupled to the second voltage source; and a second transistor having a control terminal, a first current terminal coupled to the antifuse second terminal, and a second current terminal coupled to the reference voltage source;

the circuit further comprising:

a read enable terminal coupled to the second transistor control terminal;

a program enable terminal; and a third transistor having a control terminal coupled to the program enable terminal, a first current terminal coupled to the first voltage source, and a second current terminal coupled to the first transistor control terminal.

19. A circuit as in claim 18 further comprising a voltage bias and discharge circuit having a control terminal coupled to the first voltage source, a first terminal coupled to the first transistor control terminal, and a second terminal coupled to the second voltage source.

20. A method of programming an antifuse and retaining a state of the antifuse in a circuit comprising the steps of:

coupling a first voltage source to a first terminal of the antifuse;

coupling a second voltage source to a second terminal of the antifuse, wherein the voltage difference between the first and second voltage sources causes the antifuse to be programmed;

decoupling the second voltage source from the antifuse second terminal;

coupling a reference voltage source, isolated from the second voltage source, to the antifuse second terminal;

coupling a discharge path to the reference voltage source across the antifuse; and discharging any residual charge on the antifuse via the discharge path;

wherein a multiplexer couples and decouples the second voltage source to the antifuse second terminal and couples the reference voltage source to the antifuse second terminal.

21. A method as in claim 20 further comprising the step of: decoupling the first voltage source from the antifuse first terminal.

22. A method of programming an antifuse and retaining a state of the antifuse in a circuit comprising the steps of:

coupling a first voltage source to a first terminal of the antifuse;

coupling a second voltage source to a second terminal of the antifuse, wherein the voltage difference between the first and second voltage sources causes the antifuse to be programmed;

decoupling the second voltage source from the antifuse second terminal;

coupling a reference voltage source, isolated from the second voltage source, to the antifuse second terminal;

coupling a discharge path to the reference voltage source across the antifuse; and discharging any residual charge on the antifuse via the discharge path;

wherein the second voltage source decoupling step includes:

receiving a select signal on an input terminal of a multiplexer;

applying a first signal corresponding to the select signal to a control terminal of a first switch coupled between the antifuse second terminal and the second voltage source; and applying a second signal corresponding to the select signal to a control terminal of a second switch coupled between the antifuse second terminal and the second voltage source;

wherein the first signal allows the first switch to conduct and the second signal allows the second switch to conduct.

23. A method as in claim 22 further comprising the step of:

after decoupling the second voltage source, discharging the control terminal of the first switch.

* * * * *